(12) United States Patent
Dolci et al.

(10) Patent No.: US 9,048,124 B2
(45) Date of Patent: Jun. 2, 2015

(54) HEAT SINKING AND ELECTROMAGNETIC SHIELDING STRUCTURES

(71) Applicants: Dominic E. Dolci, Berkeley, CA (US); James G. Smeenge, Los Gatos, CA (US); Vinh H. Diep, Palo Alto, CA (US); Chiew-Siang Goh, San Jose, CA (US)

(72) Inventors: Dominic E. Dolci, Berkeley, CA (US); James G. Smeenge, Los Gatos, CA (US); Vinh H. Diep, Palo Alto, CA (US); Chiew-Siang Goh, San Jose, CA (US)

(73) Assignee: Apple Inc., Cupertino, CA (US)

( * ) Notice: Subject to any disclaimer, the term of this patent is extended or adjusted under 35 U.S.C. 154(b) by 148 days.

(21) Appl. No.: 13/623,436

(22) Filed: Sep. 20, 2012

(65) Prior Publication Data
US 2014/0078677 A1 Mar. 20, 2014

(51) Int. Cl.
*H05K 7/20* (2006.01)
*H01L 23/10* (2006.01)
(Continued)

(52) U.S. Cl.
CPC .............. *H01L 23/10* (2013.01); *H01L 23/552* (2013.01); *H01L 24/13* (2013.01); *H01L 24/16* (2013.01);
(Continued)

(58) Field of Classification Search
CPC ................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H05K 7/20218–7/20381; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00; H01L 23/473
USPC ....................... 361/679.46–679.54, 688–723, 361/728–747, 752–759, 796–802, 361/805–837; 165/80.4–80.5, 104.33, 185; 174/15.1–15.3, 16.1–16.3, 350–397, 174/520–565; 257/714–716
See application file for complete search history.

(56) References Cited

U.S. PATENT DOCUMENTS
5,294,826 A * 3/1994 Marcantonio et al. ........ 257/659
5,357,404 A * 10/1994 Bright et al. .................. 361/818
(Continued)

FOREIGN PATENT DOCUMENTS
JP H0927576 1/1997

*Primary Examiner* — Anthony Haughton
*Assistant Examiner* — Razmeen Gafur
(74) *Attorney, Agent, or Firm* — Treyz Law Group; G. Victor Treyz; Joseph F. Guihan

(57) ABSTRACT

An electronic device may be provided with electronic components such as radio-frequency transceiver integrated circuits and other integrated circuits that are be sensitive to electromagnetic interference. Metal structures are configured to serve both as heat sinking structures for the electrical components and electromagnetic interference shielding. Components are mounted to the substrate using solder. Metal fence structures are also soldered to the substrate. Each metal fence has an opening that covers a respective one of the components. A thermally conductive elastomeric gap filler pad is mounted in the opening. A metal heat spreading structure is electrically shorted to the fence using a conductive gasket that surrounds the gap filler pad so that the structure serves as an electromagnetic interference shield. Heat from the component travels through the gap filler pad to the metal heat spreading structure so that the heat spreading structure may laterally spread and dissipate the heat.

14 Claims, 8 Drawing Sheets

(51) Int. Cl.
*H01L 23/552* (2006.01)
*H01L 23/40* (2006.01)
*H01L 23/473* (2006.01)
*H01L 23/00* (2006.01)
*H01L 25/065* (2006.01)
*H01L 23/373* (2006.01)

(52) U.S. Cl.
CPC .............. *H01L 24/32* (2013.01); *H01L 24/73* (2013.01); *H01L 25/0655* (2013.01); *H01L 2224/131* (2013.01); *H01L 2224/16225* (2013.01); *H01L 2224/32225* (2013.01); *H01L 2224/32245* (2013.01); *H01L 2224/73253* (2013.01); *H01L 2924/14* (2013.01); *H01L 2924/1421* (2013.01); *H01L 2924/1434* (2013.01); *H01L 2924/16251* (2013.01); *H01L 2924/167* (2013.01); *H01L 23/373* (2013.01); *H01L 23/3736* (2013.01); *H01L 23/40* (2013.01); *H01L 23/4006* (2013.01)

(56) References Cited

U.S. PATENT DOCUMENTS

| | | | |
|---|---|---|---|
| 5,541,811 A * | 7/1996 | Henningsson et al. | 361/704 |
| 5,650,915 A * | 7/1997 | Alfaro et al. | 361/707 |
| 6,011,697 A * | 1/2000 | Budnaitis et al. | 361/792 |
| 6,018,460 A * | 1/2000 | Borowiec et al. | 361/704 |
| 6,122,167 A | 9/2000 | Smith et al. | 361/679.47 |
| 6,208,516 B1 * | 3/2001 | Fangonilo et al. | 361/704 |
| 6,590,783 B2 * | 7/2003 | Spratte et al. | 361/800 |
| 7,176,564 B2 * | 2/2007 | Kim | 257/714 |
| 7,323,358 B1 * | 1/2008 | Cromwell | 438/106 |
| 7,475,175 B2 | 1/2009 | Klein et al. | |
| 7,560,812 B2 | 7/2009 | Kuo et al. | |
| 7,589,968 B1 | 9/2009 | Oliver | |
| 7,880,282 B2 | 2/2011 | Holland | |
| 7,999,196 B2 * | 8/2011 | Hsieh | 174/386 |
| 8,379,408 B2 * | 2/2013 | Hankui | 361/818 |
| 8,446,739 B2 * | 5/2013 | Harikae | 361/816 |
| 8,654,537 B2 * | 2/2014 | Fisher et al. | 361/750 |
| 2001/0033478 A1* | 10/2001 | Ortiz et al. | 361/818 |
| 2003/0161112 A1* | 8/2003 | Katoh et al. | 361/719 |
| 2003/0169583 A1* | 9/2003 | Watanabe | 361/818 |
| 2004/0014508 A1* | 1/2004 | Seo et al. | 455/575.5 |
| 2004/0042178 A1* | 3/2004 | Gektin et al. | 361/705 |
| 2007/0086168 A1* | 4/2007 | Khanna et al. | 361/719 |
| 2007/0183128 A1* | 8/2007 | Pirillis et al. | 361/715 |
| 2007/0211436 A1* | 9/2007 | Robinson et al. | 361/719 |
| 2008/0043453 A1* | 2/2008 | Horng | 361/818 |
| 2008/0218970 A1* | 9/2008 | Kehret et al. | 361/699 |
| 2009/0237891 A1* | 9/2009 | Liu et al. | 361/714 |
| 2009/0244878 A1* | 10/2009 | Wurzel et al. | 361/818 |
| 2009/0279255 A1* | 11/2009 | Sauciuc et al. | 361/697 |
| 2009/0316366 A1* | 12/2009 | Mullen et al. | 361/717 |
| 2010/0134983 A1* | 6/2010 | Rechenberg | 361/715 |
| 2010/0309631 A1* | 12/2010 | Hill et al. | 361/705 |
| 2011/0044019 A1* | 2/2011 | Hankui | 361/818 |
| 2011/0147920 A1* | 6/2011 | Choudhury et al. | 257/712 |
| 2011/0157832 A1* | 6/2011 | Hongo | 361/707 |
| 2011/0242767 A1* | 10/2011 | Okamoto et al. | 361/714 |
| 2011/0292612 A1 | 12/2011 | Osenbach et al. | |
| 2012/0033381 A1* | 2/2012 | Matsumoto et al. | 361/697 |
| 2012/0181073 A1* | 7/2012 | Rendek et al. | 174/258 |

\* cited by examiner

HEAT SINKING AND ELECTROMAGNETIC SHIELDING STRUCTURES

BACKGROUND

This relates generally to electronic devices and, more particularly, to radio-frequency shielding and thermal management structures for components in electronic devices.

Electronic devices often contain components such as radio-frequency transmitters and other circuits that use electromagnetic interference (EMI) shielding structures. Electromagnetic interference shielding structures may help prevent radio-frequency signals that are generated by one component from disrupting the operation of another component that is sensitive to radio-frequency interference. Electromagnetic shielding structures may be formed from metal shielding cans soldered to printed circuit boards. A typical shielding has an inner metal fence and an outer metal lid structure.

The operation of integrated circuits such as radio-frequency transmitters and other circuitry tends to generate heat. To properly dissipate heat that is generated during operation, heat sink structures may be thermally coupled to the exterior of an electromagnetic shielding can. To ensure satisfactory heat transfer from a shielded integrated circuit to a heat sink, a thermally conductive elastomeric pad may be interposed between the integrated circuit and the shielding can to fill air gaps between the integrated circuit and the shielding can and another thermally conductive elastomeric pad may be interposed between the shielding can and the heat sink. The use of multiple thermally conductive paths and separate heat sink and electromagnetic interference shielding structures tends to make designs of this type complex and costly and may reduce the efficacy of the overall structure in removing heat from a component during operation.

It would therefore be desirable to be able to provide improved ways in which to provide components in electronic devices with heat sinking and electromagnetic interference shielding structures.

SUMMARY

An electronic device may be provided with electronic components such as radio-frequency transceiver integrated circuits and other integrated circuits that are sensitive to electromagnetic interference. Metal heat spreading structures can be configured to serve both as heat sinking structures for the electrical components and electromagnetic interference shielding.

The electronic components are mounted to a dielectric substrate using solder. The dielectric substrate is formed from a rigid or flexible printed circuit or other dielectric material. Metal fence structures are soldered to the substrate over the components. Each metal fence has an opening that overlaps a respective one of the components. A thermally conductive structure such as an elastomeric gap filler pad is mounted in each opening.

The metal heat spreading structures are electrically shorted to each fence structure using a conductive gasket that surrounds the gap filler pad in that fence. This allows the metal heat spreading structure to serve as part of an electromagnetic interference shield.

Heat from the components travels through the gap filler pads on the components to the metal heat spreading structure. The heat spreading structure may laterally spread and dissipate the heat.

If desired, a heat spreading structure may be mounted directly over a component. In this type of configuration, sidewall portions of the heat spreading structure are shorted to traces on the substrate. A recess in the heat spreading structure is configured to receive the component. A gap filler or other thermally conductive structure is interposed between the component and the upper surface of the recess.

Further features, their nature and various advantages will be more apparent from the accompanying drawings and the following detailed description of the preferred embodiments.

DETAILED DESCRIPTION

Figure 1:
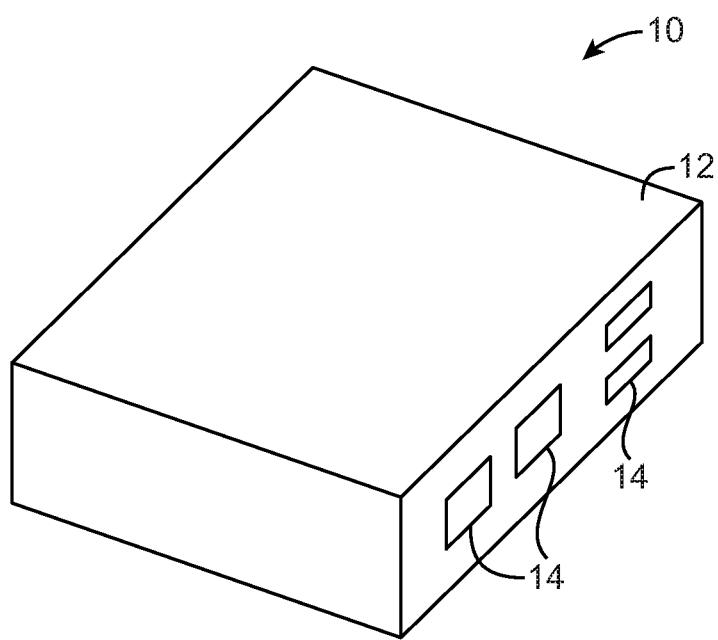
FIG. 1 is a perspective view of an illustrative electronic device of the type that may be provided with electromagnetic interference shielding and thermal management structures in accordance with an embodiment.

An electronic device may be provided with electronic components such as integrated circuits. These components may be provided with electromagnetic interference and heat sinking structures (sometimes referred to as heat spreading structures, heat spreaders, heat spreader structures, or thermal management structures). An illustrative electronic device is shown in FIG. 1. Electronic device 10 of FIG. 1 has openings 14 in housing 12. Openings 14 form connector ports for connectors such as Ethernet plugs, Universal Serial Bus connectors, power connectors, audio jacks, and other connectors. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or can be formed using multiple structures (e.g., an internal frame structure, one or more structures that form exterior housing surfaces, etc.).

Electronic device 10 of FIG. 1 is a set-top box that provides video signals to a television or other display. If desired, electronic device 10 may be implemented using other types of equipment such as cellular telephones, media players, other handheld portable devices, somewhat smaller portable devices such as wrist-watch devices, pendant devices, or other wearable or miniature devices, gaming equipment, tablet computers, notebook computers, desktop computers, televisions, computer monitors, computers integrated into computer displays, wireless access points, or other electronic equipment. The use of a set-top box form factor in implementing device 10 is merely illustrative.

Figure 2:
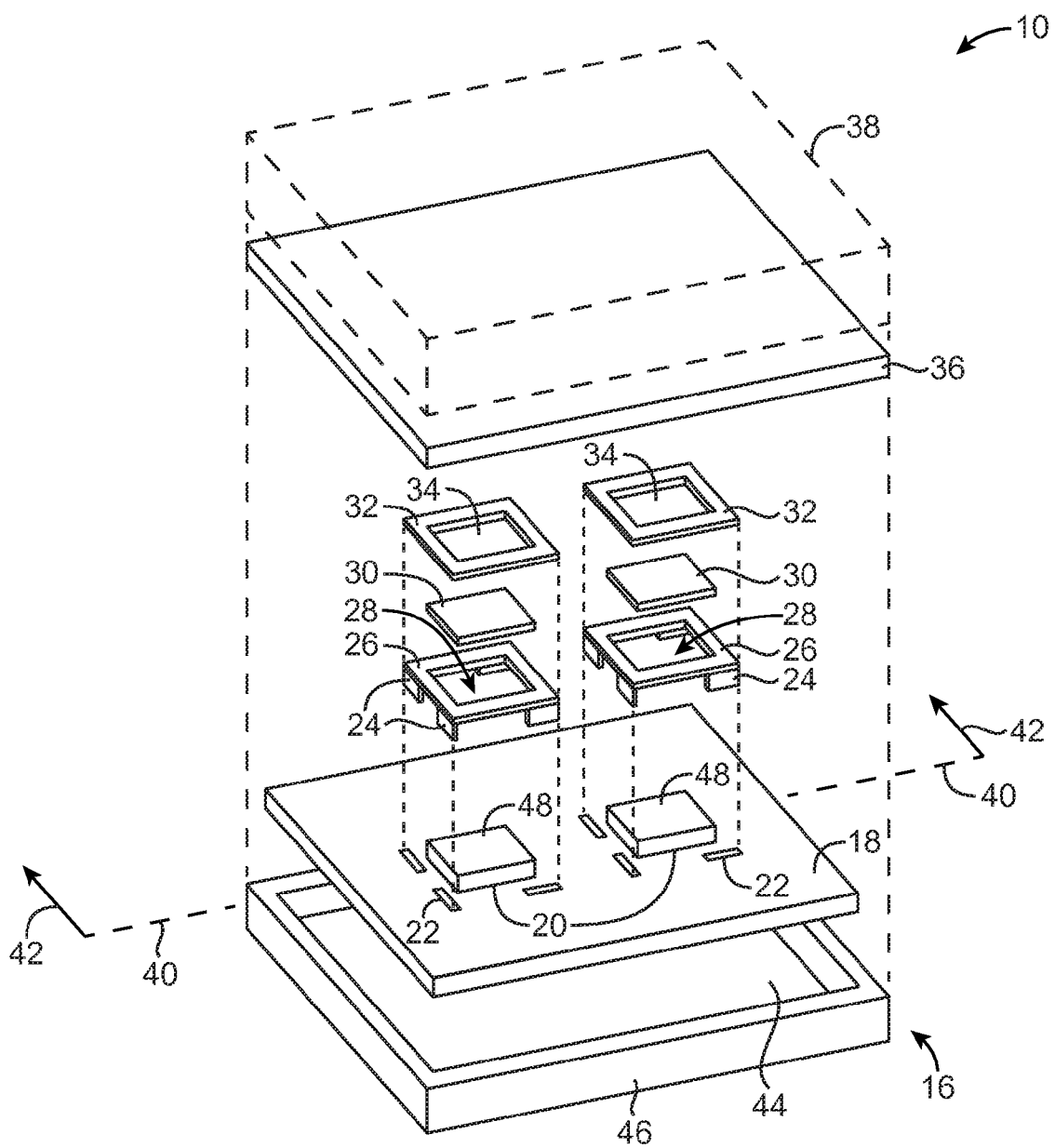
FIG. 2 is an exploded perspective view of an illustrative electronic device with electromagnetic interference shielding and thermal management structures in accordance with an embodiment.

An exploded perspective view of device 10 is shown in FIG. 2. As shown in FIG. 2, device 10 has housing base structure 16. Housing structure 16 has sidewall portions 46 that surround recessed rear portion 44. Housings with other shapes and sizes may be used for device 10 if desired.

Components 20 are mounted on dielectric substrate 18. Components 20 may include integrated circuits, discrete components such as resistors, capacitors, and inductors, connectors, and other circuitry. Examples of integrated circuits that may be used in forming components 20 include memory circuits, clock circuits, display driver circuits, radio-frequency integrated circuits such a radio-frequency transceiver circuitry associated with cellular telephone communications, radio-frequency transceiver circuitry associated with wireless local area network (WLAN) communications, satellite navigation system integrated circuits such as a Global Positioning System receiver, wireless radio-frequency transceiver circuitry for Bluetooth® communications, processors, power amplifiers, timing circuits, wireless circuits, and other circuitry. Substrate 18 may be a printed circuit board, a flexible printed circuit such as a printed circuit formed from a flexible sheet of polyimide or a layer of other polymer material, a rigid printed circuit board formed from fiberglass-filled epoxy or other printed circuit board substrate material, a dielectric such as plastic, glass, or ceramic, or other insulating material. Configurations in which dielectric substrate 18 is a printed circuit are sometimes described herein as an example.

Components 20 are soldered on printed circuit substrate 18 using solder. Fences 26 have leg portions 24 that are soldered to printed circuit substrate 22 using solder on solder pads 22. Fences 26 are formed from metal. Other types of materials may be used to form fences if desired. Fences 26 have openings 28. Openings 28 overlap components 20 and have shapes and sizes that are configured to expose upper surfaces 48 of components 20.

Thermally conductive elastomeric pads 30, which may sometimes be referred to as gap-filling pads or gap pads, have shapes such as rectangular shapes that are configured to be received within openings 28. Elastomeric pads 30 are formed from elastomeric polymer material filled with thermally conductive material such as metal particles. During operation of device 10, thermally conductive pads 30 are compressed between upper surfaces 48 of components 20 and the lower surface of structures 36. Structures 36 are formed from metal and are therefore thermally and electrically conductive. With one illustrative configuration, structures 36 are formed from aluminum. Examples of other materials that may be used in forming structures 36 include stainless steel and carbon-fiber composites or other fiber-based composites.

Conductive structures such as conductive gaskets 32 are used to couple fences 26 to metal structure 36. Conductive gaskets 32 have shapes that are configured to match the outlines of fences 26. Conductive gaskets 32 may, as an example, have rectangular ring shapes with outlines that match the rectangular outlines of fences 26 and openings 34 that match the shape of gap pads 30 and openings 28. Examples of materials that may be used in forming conductive gaskets 26 include compressible materials such as conductive foam, conductive adhesive, and conductive fabric (e.g., fabric formed from thin metal wires and/or plastic wires coated with metal).

Because metal structures 36 are sufficiently thermally conductive to spread and help dissipate heat, metal structures 36 may sometimes be referred to as metal heat spreader structures, metal thermal management structures, or metal heat sink structures. Metal structures 36 can be configured to mate with structures 16 so that structures 36 and 16 form some or all of a metal housing for device 10 (i.e., so that structures 36 and 16 form housing 12 of FIG. 1). If desired, optional housing structure 38 can be configured to mate with structures 16. Optional housing structures 38 may be formed from plastic, metal, or other materials and may have a shape that covers metal structure 36. In configurations in which housing structures 38 and structure 16 form housing 12 in this way, housing structures 38 can be provided with a recess or other shape that receives heat spreader 36.

When assembled to form device 10, electromagnetic shielding functions are provided by the metal of fences 26, conductive gasket structures 32, and the metal of structures 36. Ground plane metal (e.g., ground traces) in substrate 18 and/or metal in housing portion 16 may also be used in forming electromagnetic shielding functions. Thermal conduction is provided by gap pads 30 and metal structure 36. Metal structure 36 therefor serves both as an electromagnetic shielding structure that prevents interference from disruption device operation and as a heat sink that dissipates heat from underlying components 20.

Figure 3:
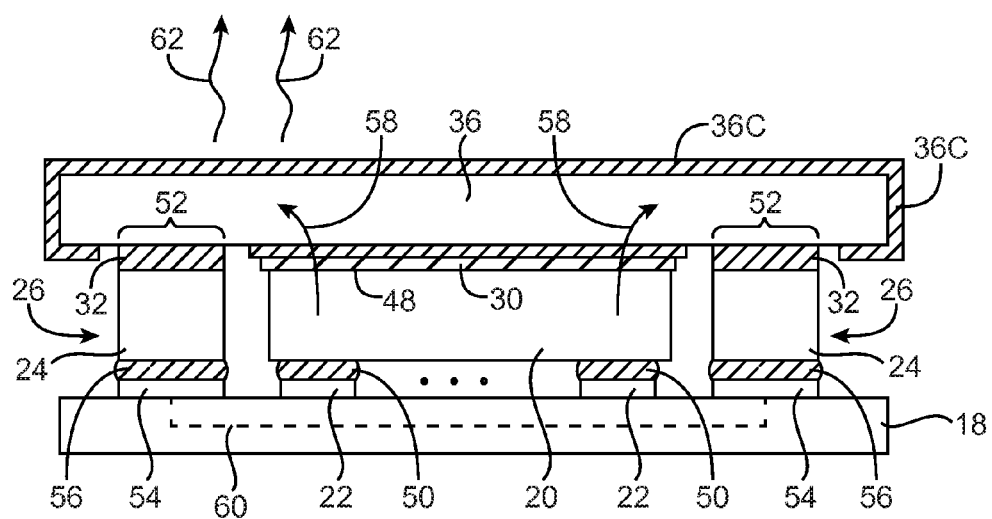
FIG. 3 is a cross-sectional side view of electromagnetic interference shielding and thermal management structures in accordance with an embodiment.

A cross-sectional view of device 10 of FIG. 2 taken along line 40 and viewed in direction 42 is shown in FIG. 3. As shown in FIG. 3, vertically extending leg portions 24 of fence 26 are soldered to metal solder pads 54 on substrate 18 using solder 56. Electrical component 20 (e.g., an integrated circuit) is soldered to metal solder pads 22 on substrate 18 using solder 50.

Metal structure 36 of FIG. 3 is formed from aluminum and has a thin insulating coating. Coating 36C in the FIG. 3 example is formed from aluminum oxide. Other insulating coatings may be formed on metal structure 36 and metal structure 36 may be formed from materials other than aluminum, if desired.

To ensure that metal structure 36 is electrically connected to gasket 32 and fence 26 (and, if desired, to internal metal traces such as metal ground traces 60 in substrate 18), insulating coating 36C is removed (e.g., by laser etching or other suitable removal techniques) from regions 52 on the underside of metal structure 36. Because regions 52 are free of insulating material (i.e., because regions 52 are associated with exposed metal), conductive gasket 32 electrically shorts fence 26 to metal structures 36. This allows metal structures 36 (in combination with fence 26 and, if desired, traces 60) to form an electromagnetic interference shield for component 20.

Gap filler pad 30 is compressed between upper surface 48 of component 20 and the opposing lower surface of metal structure 36. This provides a thermal path between component 20 and structure 36. Gap pad 30 has a relatively high thermal conductivity. The high thermal conductivity of gap pad 30 (e.g., 0.3 W/mK or more, 1 W/mK or more, or 2.5 W/mK or more) allows heat to flow from component 20 to structure 36 in vertical dimension Z and to spread laterally outward in the X-Y plane of FIG. 3, as illustrated by lines 58. Lines 62 show how the heat that has been spread throughout structure 36 in this way dissipates outwards into the surrounding environment. Structure 36 therefore serves not only as an electromagnetic interference shield for component 20, but also serves as a heat sinking structure for component 20. The configuration used for the metal structures of FIG. 3 therefore integrates thermal management features and electromagnetic shielding.

Figure 4:
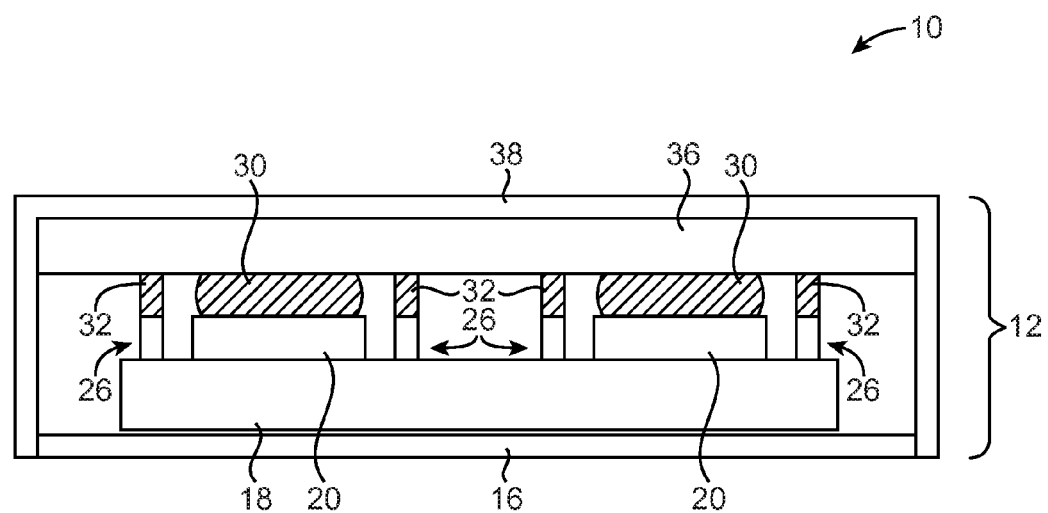
FIG. 4 is a cross-sectional side view of an electronic device having a housing in which electromagnetic interference shielding and thermal management structures have been installed in accordance with an embodiment.

If desired, housing 12 may be formed from structures that are separate from metal structure 36. This type of configuration is shown in FIG. 4. As shown in FIG. 4, multiple components 20 may be mounted on substrate 18. Housing 12 of FIG. 4 includes upper structure 38 and lower structure 16. Upper structure 38 and lower structure 16 are formed from a material such as metal, plastic, or fiber-based composite material (as examples). Metal structure 36 overlaps one or more components 20. Upper housing structure 38 serves as a cover that overlaps and covers the upper surface of metal structure 36. Upper housing structure 38 of FIG. 4 also have sidewalls that cover the edges of device 10 and that mate with the peripheral edges of lower housing structure 16.

Figure 5:
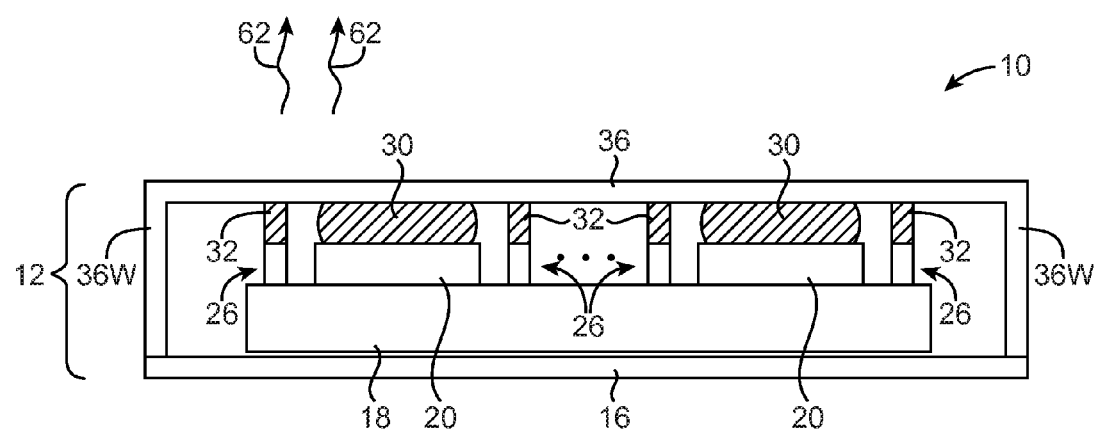
FIG. 5 is a cross-sectional side view of an electronic device having a housing that is used in forming electromagnetic interference shielding and thermal management structures in accordance with an embodiment.

In the illustrative configuration of FIG. 5, housing 12 is formed from metal structure 36 and structure 16. Metal structure 36 has sidewall portions 36W that serve as housing sidewalls. Metal structure 36 mates with housing structure 16 along the lower edges of sidewalls 36W. Because no separate housing structure is used to cover the exposed upper surface of metal structure 36 in the configuration of FIG. 5, heat 62 may be radiated directly into the surrounding environment from metal structure 36 without passing through intermediate housing structures.

Figure 6:
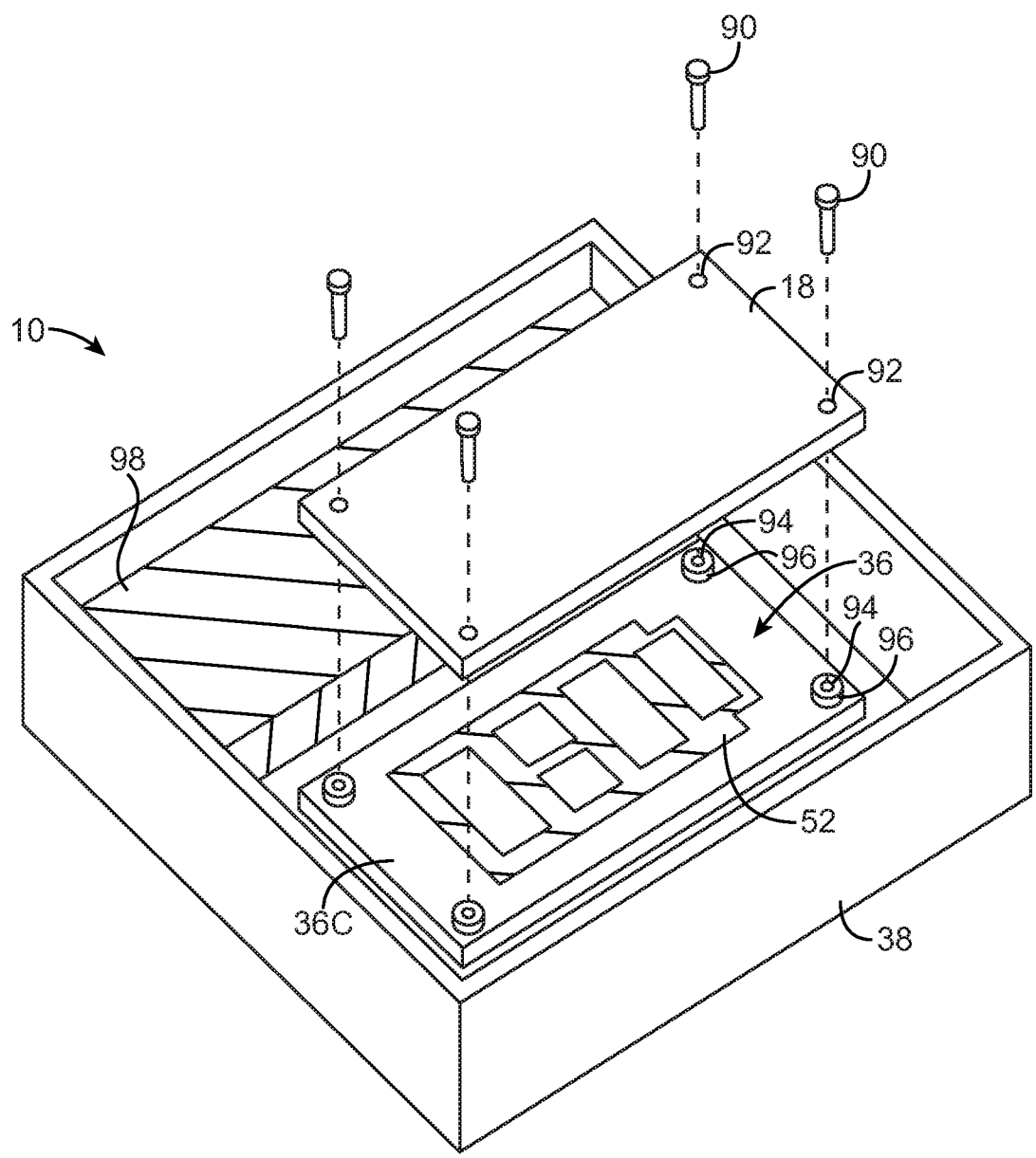
FIG. 6 is an exploded rear perspective view of an illustrative electronic device with electromagnetic interference shielding and thermal management structures in accordance with an embodiment.

FIG. 6 is an exploded rear perspective view of device 10 (with lower housing portion 16 removed) in a configuration in which screws 90 are used to attach substrate 18 to device 10. Substrate 18 has screw holes 92 through which the shafts of screws 90 pass. Screws 96 are used to attach metal structure 36 to housing structure 38. Screws 96 have threaded holes 94 that are configured to receive the threaded shafts of screws 90. Portions 36C of metal structure 36 are coated with an insulating coating such as aluminum oxide, but portions 52 are free of insulating coating. When substrate 18 is screwed into place on metal structure 52, gasket structures 32 are compressed against bare metal portion 52 of metal structure 36. Housing 38 of FIG. 6 contains components 98 in addition to the components that are covered with metal structure 36.

Figure 7:
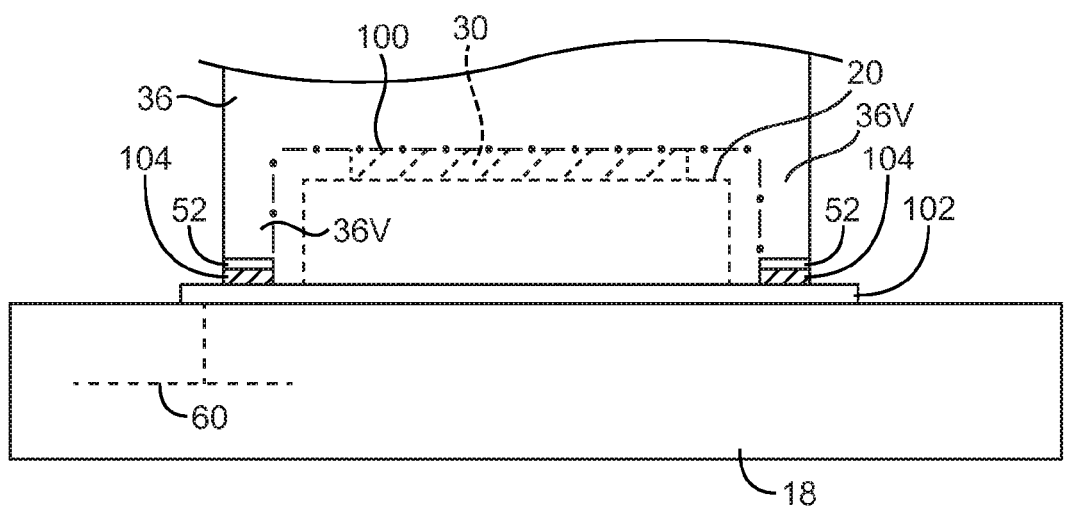
FIG. 7 is a cross-sectional side view of electromagnetic interference shielding and thermal management structures that have been coupled to a printed circuit substrate and that include a recess for accommodating a component in accordance with an embodiment.

If desired, metal structure 36 may be mounted directly to substrate 18. This type of configuration is shown in FIG. 7. As shown in FIG. 7, metal structure 36 has one or more recesses (cavities) such as recess 100 that are configured to receive components such as component 20. Thermally conductive gap filler pad 30 is coupled between component 20 and the inner surface of recess 100 to transfer heat from component 20 to metal structure 36 during operation.

Portions 36V of metal structure 36 form sidewalls that help enclose and electromagnetically shield component 20. To electrically couple metal structure 36 to metal traces in substrate 18 such as metal trace (solder pad) 102 and internal traces 60 (e.g., ground traces), conductive structures 104 are coupled between metal structures 36 (i.e., portions 36V) and traces 102. Conductive structures 104 may be formed from conductive adhesive, conductive fabric (e.g., metal wool or plastic fibers covered with metal), conductive foam, conductive elastomeric material, other compressible conductive materials, solder, welds, metal springs, or combinations of these structures. Metal structure 36 is formed from a metal such as aluminum and is covered with an insulating coating such as aluminum oxide. Portion 52 of metal structure 36 is free of aluminum to allow metal structure 36 to be electrically shorted to metal traces such as metal trace 102 through conductive structures 104.

Figure 8:
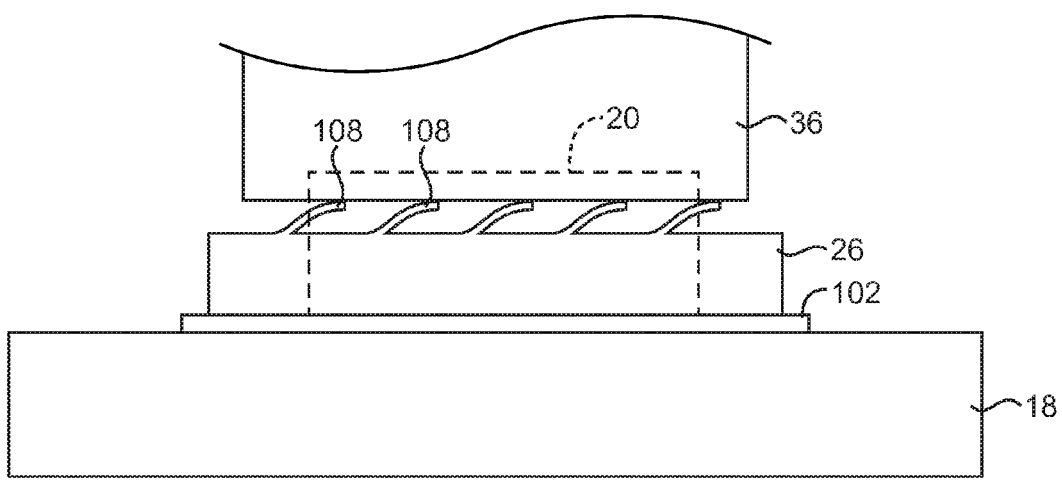
FIG. 8 is a cross-sectional side view of electromagnetic interference shielding and thermal management structures that have been coupled to a metal fence structure on a printed circuit substrate in accordance with an embodiment.

FIG. 8 is a cross-sectional side view of device 10 in a configuration of the type shown in FIG. 7 where metal structure 36 contacts protruding portions 108 of fence 26. Component 20 may protrude into a recess in the lower portion of metal structure 36 or may lie flush with the lower surface of metal structure 36. A thermally conductive gap filler pad (see, e.g., pad 30 of FIG. 2) is interposed between component 20 and metal structure 36 to enhance thermal conductivity. Metal protrusions 108 (e.g., metal spring structures) may be located no more than a quarter of a wavelength apart at radio-frequency operating frequencies of interest, to ensure that fence 26 and metal structure 36 provide satisfactorily shielding for electromagnetic interference. If desired, protrusions 108 may be supplemented by or replaced by conductive structures such as conductive adhesive, conductive fabric, conductive foam, conductive elastomeric material, other compressible conductive materials, solder, welds, or combinations of these materials.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing with first and second opposing planar surfaces, wherein the electronic device has an exterior, and wherein the housing forms the entire exterior of the electronic device;
   a dielectric substrate;
   at least one electrical component mounted on the dielectric substrate; and
   a metal heat spreader structure that is configured to dissipate heat from the electrical component and that is configured to serve as part of an electromagnetic interference shield for the electrical component, wherein the component comprises a radio-frequency transceiver integrated circuit, and wherein the metal heat spreader structure forms the first surface of the housing.

2. The electronic device defined in claim 1 further comprising:
   a metal fence surrounding the electrical component, wherein the metal heat spreader structure is shorted to the metal fence.

3. The electronic device defined in claim 2 further comprising a conductive gasket that is interposed between the metal heat spreader structure and the metal fence and that electrically shorts the metal structure to the metal frame.

4. The electronic device defined in claim 3 wherein the conductive gasket comprises a conductive material selected from the group consisting of: conductive foam, conductive fabric, and conductive adhesive.

5. The electronic device defined in claim 3 wherein the metal heat spreader structure comprises aluminum coated with aluminum oxide, wherein the aluminum has an exposed portion that is free of the aluminum oxide, and wherein the conductive gasket electrically shorts the metal frame to the exposed portion.

6. The electronic device defined in claim 5 further comprising a thermally conductive elastomeric gap filler pad interposed between the component and the metal heat spreader structure.

7. The electronic device defined in claim 6 wherein the metal fence has an opening over the electrical component and wherein the thermally conductive elastomeric gap filler pad is received within the opening.

8. The electronic device defined in claim 2 further comprising solder pads on the dielectric substrate and solder with which the metal fence is soldered to the solder pads.

9. The electronic device defined in claim 2 wherein the dielectric substrate comprises a printed circuit.

10. An electronic device, comprising:
a printed circuit having solder pads;
an integrated circuit mounted on the printed circuit, wherein the integrated circuit comprises a radio-frequency transceiver;
a metal fence structure soldered to the solder pads, wherein the metal fence structure has an opening that overlaps the integrated circuit;
a thermally conductive layer of material in the opening that contacts the integrated circuit; and
a metal heat sink structure that contacts the thermally conductive layer of material, wherein the metal heat sink structure comprises aluminum covered at least partly with an insulating coating, and wherein a portion of the aluminum is free of the insulating coating and is electrically shorted to the metal fence structure.

11. The electronic device defined in claim 10 further comprising a compressible conductive gasket interposed between the portion of the aluminum that is free of the insulating coating and the metal fence structure.

12. Apparatus, comprising:
a printed circuit board;
at least one trace on the printed circuit board;
an electrical component mounted on the substrate;
a metal fence mounted to the at least one trace to surround the electrical component;
a metal heat spreader structure that is configured to dissipate heat from the electrical component and configured to serve with the metal fence as part of an electromagnetic shield for the electrical component, wherein the metal heat spreader structure comprises aluminum coated with aluminum oxide, wherein the aluminum has an exposed portion that is free of the aluminum oxide; and
a conductive gasket that electrically shorts the metal frame to the exposed portion of the metal heat spreader structure.

13. The apparatus defined in claim 12 further comprising a thermally conductive elastomeric gap filler pad interposed between the electrical component and the metal heat spreader structure.

14. The apparatus defined in claim 12 wherein the electrical component comprises a radio-frequency transceiver.

* * * * *